United States Patent
Miyahara et al.

[11] Patent Number: 6,097,598
[45] Date of Patent: Aug. 1, 2000

[54] THERMAL CONDUCTIVE MEMBER AND ELECTRONIC DEVICE USING SAME

[75] Inventors: Masaharu Miyahara; Kenji Suga, both of Nakatsu, Japan

[73] Assignee: Matsushita Electric Industrial Co., Ltd., Osaka, Japan

[21] Appl. No.: 09/022,624

[22] Filed: Feb. 12, 1998

[30] Foreign Application Priority Data

Feb. 24, 1997 [JP] Japan .................................. 9-038716

[51] Int. Cl.⁷ ..................................................... H05K 7/20
[52] U.S. Cl. ..................... 361/704; 165/80.2; 165/80.3; 165/185; 174/16.3; 257/707; 257/713; 361/710
[58] Field of Search ................................ 165/80.2, 80.3, 165/185; 174/252, 16.3; 257/706–707, 712–713; 361/704–708, 712, 713, 717–718, 722

[56] References Cited

U.S. PATENT DOCUMENTS

| | | | |
|---|---|---|---|
| 4,648,008 | 3/1987 | Neyroud et al. | 361/709 |
| 4,858,073 | 8/1989 | Gregory | 361/708 |
| 4,979,074 | 12/1990 | Morley et al. | 361/706 |
| 4,999,741 | 3/1991 | Tyler | 361/705 |
| 5,166,864 | 11/1992 | Chitwood et al. | 361/705 |
| 5,175,668 | 12/1992 | Kendel | 361/720 |

FOREIGN PATENT DOCUMENTS

| | | |
|---|---|---|
| 2174294 | 7/1990 | Japan . |
| 3129757 | 6/1991 | Japan . |
| 5299546 | 11/1993 | Japan . |

*Primary Examiner*—Gregory Thompson
*Attorney, Agent, or Firm*—Stevens, Davis, Miller & Mosher, L.L.P.

[57] ABSTRACT

There is disclosed a thermal conductive member which can be easily handled, and has high thermal conductivity and the high ability of intimate contact with a heat-generating device and a heatsink, and applies a small stress to a semiconductor package. An electronic device, using this thermal conductive member, is also disclosed. The thermal conductive member connects the heat-generating member to the heatsink serving to radiate heat generated by said heat-generating member, and includes an elastic member, and a thermal conductive foil wound on an elastic member in intimate contact therewith. The electronic device includes the heat-generating member such as a semiconductor, the heatsink for radiating heat generated by the heat-generating member, and the above thermal conductive member interposed between the heat-generating device and the heatsink. Even if the elastic member is made of nitrile rubber or silicone rubber, and the thermal conductive foil is made of graphite, copper or aluminum, the thermal conductivity is effected satisfactorily through the elastic member and the high thermal conductivity foil.

2 Claims, 2 Drawing Sheets

THERMAL CONDUCTIVE MEMBER AND ELECTRONIC DEVICE USING SAME

BACKGROUND OF THE INVENTION

1. Field of the Invention

This invention relates to a thermal conductive member for connecting a heat-generating device to a heatsink serving to radiate heat generated by the heat-generating device, and also relates to an electronic device employing this thermal conductive member.

2. Description of the Related Art

It is a common practice in the art to mount a heatsink on a semiconductor device (e.g. a discrete device such as a power transistor and an integrated circuit device such as a microprocessing unit (herein-after referred to as "MPU")), which generates a large quantity of heat, in order to cool this heat-generating device. In this case, in order to enhance the intimate contact between the heatsink and the heat-generating device, a paste-like thermal conductive member, such as silicone grease, or a sheet-like thermal conductive member with good thermal conductivity and elasticity, such as silicone rubber, is interposed between the heat-generating device and the heatsink.

A conventional thermal conductive member will be described below. FIG. 6 is a cross-sectional view of an electronic device using a conventional thermal conductive member. In FIG. 6, reference numeral 8 denotes a semiconductor device (heat-generating device), reference numeral 9 a heatsink for radiating heat generated by the heat-generating device 8, and reference numeral 10 a thermal conductive member interposed between the semiconductor device 8 and the heatsink 9 to enhance the intimate contact therebetween. The thermal conductive member 10 is required to have the high ability of intimate contact with and high thermal conductivity to the heat-generating device 8 and the heatsink 9, and silicone grease, silicone rubber and the like have heretofore been used as the thermal conductive member.

However, the conventional thermal conductive member, comprising silicone grease or silicone rubber, has the following problems.

The paste-like thermal conductive member, such as silicone grease, can fill a fine gap, and therefore can achieve a high degree of thermal conductivity. However, this thermal conductive member is in the liquid state, and therefore a control must be effected for applying a predetermined amount of coating. And besides, when the heatsink 9, once removed from the heat-generating device 8, is to be again mounted thereon, the paste-like thermal conductive material must be additionally coated. Thus, there has been encountered a problem that the handling of the paste-like thermal conductive member is rather troublesome. The sheet-like elastic thermal conductive member, such as a silicone rubber sheet, can be handled easily, and when mounting a heatsink to a low-strength package such as a semiconductor device of a tape carrier package (hereinafter referred to as "TCP"), a concentrated stress will not act on the semiconductor, which is advantageous. However, there has been encountered a problem that the sheet-like thermal conductive member is lower in thermal conductivity than silicone grease or the like.

SUMMARY OF THE INVENTION

It is an object of this invention to provide a thermal conductive member which can be easily handled, and has high thermal conductivity and the high ability of intimate contact with a heat-generating device and a heatsink, and applies a small stress to a semiconductor package.

Another object of the invention is to provide an electronic device which employs the above thermal conductive member, and has an excellent cooling performance.

According to one aspect of the present invention, there is provided a thermally conductive member for connecting a heat-generating member to a heatsink serving to radiate heat generated by the heat-generating member, comprising an elastic member, and a high thermal conductivity foil wound on the elastic member in intimate contact therewith.

This thermal conductive member can be easily handled, and has high thermal conductivity and the high ability of intimate contact with the heat-generating device and the heatsink, and applies a small stress to the semiconductor package.

According to another aspect of the invention, there is provided an electronic device comprising a heat-generating member such as a semiconductor device, a heatsink for radiating heat generated by the heat-generating member, and the above thermal conductive member interposed between the heat-generating device and the heatsink.

This electronic device, employing the above thermal conductive member, has an excellent cooling ability.

Even if the elastic member is made of nitrile rubber or silicone rubber, and the high thermal conductivity foil is made of graphite, copper or aluminum, the heat transfer is effected satisfactorily through the elastic member and the high thermal conductivity foil.

DESCRIPTION OF THE PREFERRED EMBODIMENTS

A preferred embodiment of the present invention will now be described with reference to the drawings.

Figure 1:
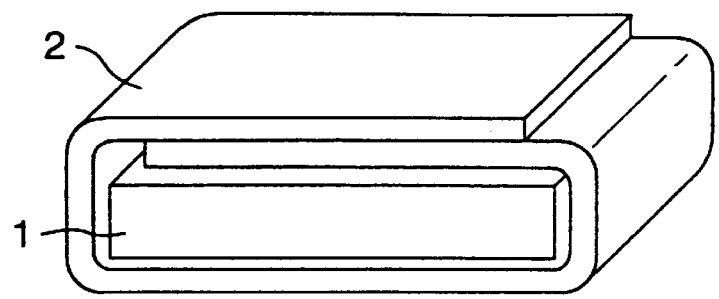
FIG. 1 is a view showing a first embodiment of a thermal conductive member according to the present invention.
Figure 2:
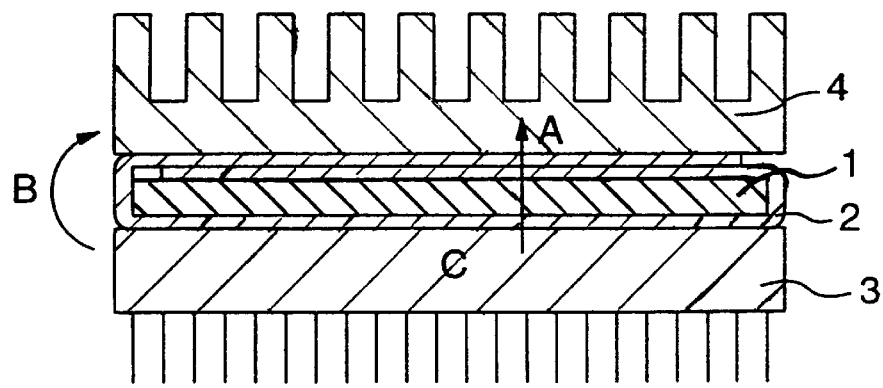
FIG. 2 is a cross-sectional view of an electronic device using the thermal conductive member in FIG. 1.

FIG. 1 is a view showing a first embodiment of a thermal conductive member according to the invention, and FIG. 2 is a cross-sectional view of an electronic device employing the thermal conductive member in FIG. 1. In FIGS. 1 and 2, reference numeral 1 denotes a sheetlike elastic member, reference numeral 2 a high thermal conductivity foil wound on the elastic member 1, reference numeral 3 a heat-generating member in the form of a semiconductor such as a MPU, and reference numeral 4 a heatsink.

The thermal conductive member of the above construction, as well as the electronic device of the above construction, will be described in further detail.

The elastic member 1 serves as a cushion between the semiconductor device 3 and the heatsink 4 so that damage will not be applied to the semiconductor device 3 when mounting the heatsink 4 on the semiconductor device 3, and the elastic member 1 also serves to fill a gap between the semiconductor device 3 and the heatsink 4 to enhance the thermal conductivity. Preferably, the elastic member 1 is made of a high heat-resistance material such as nitrile rubber and silicone rubber. Since the thermal conductivity is performed by the high thermal conductivity foil 2, the elastic member 1 does not always need to be made of a high thermal conductivity material such as silicone rubber.

A graphite sheet, having a thermal conduction anisotropy, is used as the high thermal conductivity foil 2, and its thermal conduction coefficient TK in a direction of the plane thereof is not less than 400 W/mK, and is less than 2,000 W/mK (400 W/mK≦TK <2,000 W/mK), and its thermal conduction coefficient in the direction of the plane is lower than its thermal conduction coefficient in a direction of the thickness. The thickness of the graphite sheet is about 0.1 mm. In order to compensate for the thermal conductivity of the elastic member 1 by the thermal conductivity of the high thermal conductivity foil 2 in the direction of the plane, the high thermal conductivity foil 2 is wound on the elastic member 1 as shown in FIG. 1. A copper foil, an aluminum foil or a foil of any other suitable material with high thermal conductivity can be used as the high thermal conductivity foil 2 in so far as it will not affect the cushioning properties of the elastic member 1 and the ability of the elastic material 1 to fill a gap between the semiconductor device 3 and the heatsink 4 to enhance the thermal conductivity. In view of the thermal conduction, the high thermal conductivity foil 2 is fixed to the elastic member 1 by an adhesive, an adhesive double-coated tape or the like. For example, an adhesive is coated on one side of the elastic member 1, and the high thermal conductivity foil 2 is bonded at its one end portion to this side of the elastic member 1 by the adhesive, and is wound around the elastic member 1, and is fixed at its another end portion by the adhesive. In this case, an adhesive double-coated tape may be used.

Heat, generated by the semiconductor device 3 (e.g. MPU), is transferred to the heatsink 4 through the elastic member 1 as indicated by arrow A (FIG. 2), and is radiated from the heatsink 4, and also this heat is transferred to the heatsink 4 through the high thermal conductivity foil 2 at the opposite ends of the elastic member 1 as indicated by arrow B. The high thermal conductivity foil 2 is disposed between the semiconductor device 3 and the elastic member 1 and also between the elastic member 1 and the heatsink 4, but this foil 2 is extremely thin, and therefore will not adversely affect the intimate contact of the elastic member 1 with the semiconductor device 3 and the heatsink 4. And besides, this foil 2 has high thermal conductivity, and therefore the thermal conductivity in the direction of arrow A is almost the same as that achieved without the high thermal conductivity foil 2. Also, since the high thermal conductivity foil 2 is higher in thermal conductivity than the elastic member 1, the heat in the thermal conductivity along the paths of arrow B is larger than that through the elastic member 1 in the direction of arrow A.

By thus using the flexible elastic member 1 to connect the semiconductor device (heat-generating device) 3 and the heatsink 4 together, the intimate-contact connection and the efficient thermal conductivity are achieved, and by using the high thermal conductivity foil 2, a higher degree of thermal conductivity is achieved as compared with the case where only the elastic member 1 is used, and therefore the semiconductor device 3 can efficiently generate heat.

Figure 3:
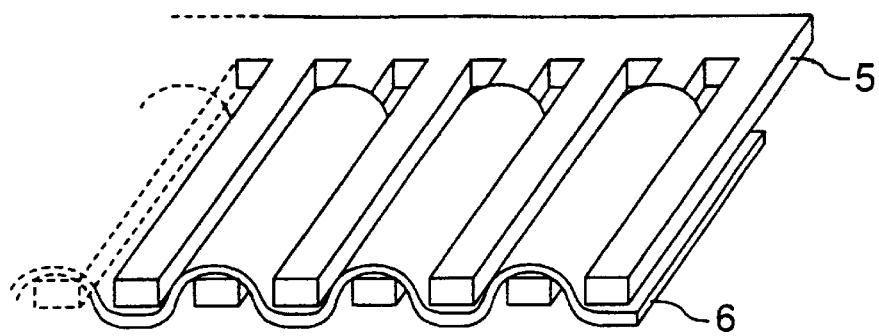
FIG. 3 is a view showing a second embodiment of a thermal conductive member according to the invention.
Figure 4:
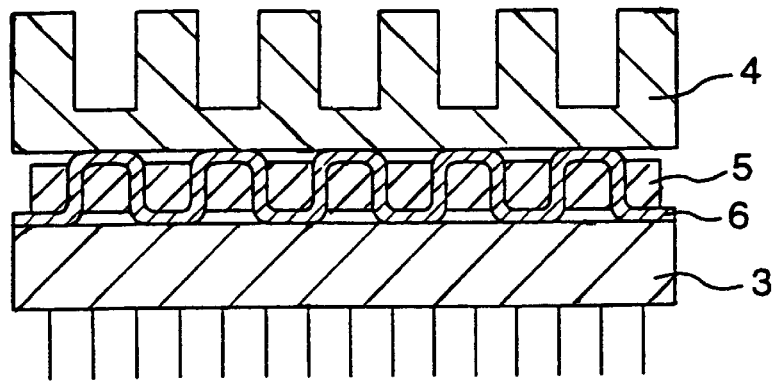
FIG. 4 is a cross-sectional view showing an electronic device using the thermal conductive member in FIG. 3.

Next, a second embodiment according to the invention will be described. FIG. 3 is a view showing a thermal conductive member of the second embodiment, and FIG. 4 is a cross-sectional view showing an electronic device employing the thermal conductive member of FIG. 3. In FIGS. 3 and 4, reference numeral 5 denotes a comb-like elastic member, reference numeral 6 a high thermal conductivity foil passed through teeth of the comb-like elastic member 5, reference numeral 3 a heat-generating member in the form of a semiconductor such as a MPU, and reference numeral 4 a heatsink.

The thermal conductive member of the above construction, as well as the electronic device of the above construction, will be described in further detail.

The comb-like elastic member 5 serves as a cushion between the semiconductor device 3 and the heatsink 4 so that damage will not be applied to the semiconductor device 3 when mounting the heatsink 4 on the semiconductor device 3, and the comb-like elastic member 5 also serves to fill a gap between the semiconductor device 3 and the heatsink 4 to enhance the thermal conductivity. Preferably, the elastic member 5 is made of a high heat-resistance material such as nitrile rubber and silicone rubber as described above for the first embodiment. Since the thermal conductivity is performed by the high thermal conductivity foil 6, the elastic member 5 does not always need to be made of a high thermal conductivity material such as silicone rubber.

The high thermal conductivity foil 6 is passed upwardly and downwardly alternately through the teeth of the comb-like elastic member 5, and with this construction, many (more than two) paths (formed by the high thermal conductivity foil 6) of thermal conductivity from the semiconductor device 3 to the heatsink 4 are provided, and therefore the thermal conductivity of the high thermal conductivity foil 6 can be utilized effectively. A graphite sheet, a copper foil or an aluminum foil can be used as the high thermal conductivity foil 6 as described above for the first embodiment.

Figure 5:
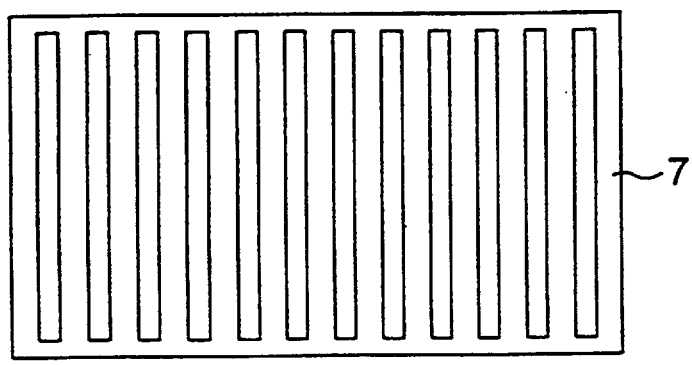
FIG. 5 is a view showing a third embodiment of a thermal conductive member according to the invention.
Figure 6:
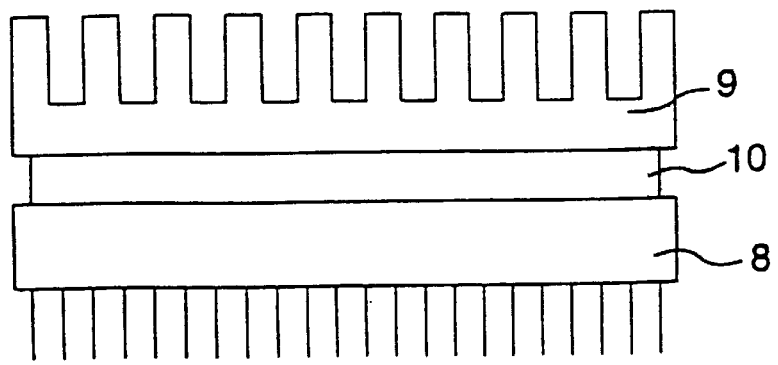
FIG. 6 is a view showing an electronic device using a conventional thermal conductive member.

Although the elastic member 5 has a comb-like configuration in this second embodiment, it may be replaced by an elastic member 7 comprising a sheet having a plurality of slits as shown in FIG. 5 showing a third embodiment of the invention. The high thermal conductivity foil 6 is passed through the slits in the elastic member 7, and with this arrangement similar effects as described for the second embodiment can be achieved.

Next, a test of comparison between an electronic device, using the thermal conductive member of the first embodiment, and electronic devices, using conventional thermal conductive members, will be described. Using MPU dummies as the semiconductor 3 and the semiconductor 8, the temperature rise at the surface of each semiconductor package was measured, and results thereof are shown in Table 1.

TABLE 1

| Thermal conductive member | Temperature rise at surface of MPU package |
|---|---|
| (1) Nitrile rubber + Carbon thermal conductivity foil | 61.5K |
| (2) Silicone grease | 60.5K |
| (3) Silicone rubber | 70.9K |

In Table 1, the upper section (1) shows the result obtained when a graphite sheet (thickness: 0.1 mm), having a thermal conduction anisotropy, was wound on a sheet of nitrile rubber (having a thickness of 2 mm and a thermal conduction coefficient of 0.2 W/mK) in intimate contact therewith. The middle section (2) shows the result for the electronic device in which silicone grease (having a thermal conduction coefficient of 0.93 W/mK) was used as the thermal conductive member, and the lower section (3) shows the result for the electronic device in which a sheet of silicone rubber (having a thickness of 1 mm and a thermal conduction coefficient of 1.3 W/mK) was used as the thermal conductive member.

As will be appreciated from the upper section (1) of Table 1, although the nitrile rubber sheet, which was lower in thermal conduction coefficient and twice as large in thickness than the silicone rubber sheet, was used, the temperature rise in the electronic device of the invention, in which the graphite sheet, having a thermal conduction anisotropy, was wound on the nitrile rubber sheet, was smaller as compared with the electronic device of the lower section (3) using the silicone rubber, and was almost the same as the temperature rise in the electronic device of the middle section (2) using the silicone grease. For fixedly securing the semiconductor device 3 and the heatsink 4 to the thermal conductive member, there is used, for example, a method in which the thermal conductive member is placed on the semiconductor device 3, and the heatsink 4 is fastened to a printed circuit board by screws, thereby fixedly holding the semiconductor device 3 and the thermal conductive member between the heatsink 4 and the printed circuit board.

In the above embodiments, although the elastic member 1 is made of nitrile rubber, it may be made of silicone rubber.

As described above, in the above embodiments, without the use of silicone grease, the control for applying the predetermined amount of coating, as well as the additional coating of the silicone grease, is unnecessary, and therefore the handling of the thermal conductive member is easier, and besides, with the use of the high thermal conductivity foil 2, the thermal conductive member has high thermal conductivity, and has the high ability of intimate contact with the heat-generating device 3 and the heatsink 4; furthermore the stress on the semiconductor package is reduced by using the elastic member 1.

In the above embodiments of the invention, although the heatsink for heat-radiating purposes has a square shape when viewed from the top thereof, it may have any other suitable shape such as a circular shape and a hexagonal shape. Although fins of the heatsink are arranged parallel to one another, they may be arranged, for example, radially, spirally or arcuately. Although the fins are arranged at substantially equal intervals, the fins may be arranged at larger intervals at those regions adjacent to the outer periphery of the heatsink.

Various modifications can be made without departing from the scope of the invention. The above embodiments have been described merely for the purpose of giving examples of the invention, and should not be construed in the limitative sense. The scope of the present invention is defined by the appended claims, and is not limited by this specification. Various modifications and changes, falling with the scope equivalent to the scope of the claims, fall within the scope of the invention.

What is claimed is:

1. A thermally conductive member for connecting a heat-generating member to a heatsink serving to radiate heat generated by said heat-generating member, comprising an elastic member, and a thermally conductive foil wound on said elastic member in intimate contact therewith, wherein said elastic member is made of a material selected from the group consisting of nitrile rubber and silicone rubber, and said thermally conductive foil is made of a material selected from the group consisting of graphite, copper and aluminum.

2. An electronic device comprising a heat-generating member, a heatsink for radiating heat generated by said heat-generating member, and a thermally conductive member for connecting a heat-generating member to a heatsink serving to radiate heat generated by said heat-generating member, wherein said heat-generating member comprises an elastic member, and a thermally conductive foil wound on said elastic member in intimate contact therewith, said elastic member is made of a material selected from the group consisting of nitrile rubber and silicone rubber, said thermally conductive foil is made of a material selected from the group consisting of graphite, copper and aluminum, and said thermally conductive member is interposed between said heat-generating member and said heatsink.

* * * * *